United States Patent
Lee et al.

(10) Patent No.: US 8,178,408 B2
(45) Date of Patent: May 15, 2012

(54) METHODS OF MANUFACTURING CHARGE TRAP-TYPE NON-VOLATILE MEMORY DEVICES

(75) Inventors: Hak-Sun Lee, Seoul (KR); Kyoung-Sub Shin, Seongnam-si (KR); Jeong-Dong Choe, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 12/651,781

(22) Filed: Jan. 4, 2010

(65) Prior Publication Data
US 2010/0173469 A1    Jul. 8, 2010

(30) Foreign Application Priority Data
Jan. 5, 2009 (KR) .................... 10-2009-0000437

(51) Int. Cl.
*H01L 21/336* (2006.01)
*H01L 21/3205* (2006.01)

(52) U.S. Cl. ... 438/259; 438/266; 438/594; 257/E21.21; 257/E21.683

(58) Field of Classification Search .......... 438/259, 438/266, 594; 257/E21.21, E21.683
See application file for complete search history.

(56) References Cited

U.S. PATENT DOCUMENTS

| | | | |
|---|---|---|---|
| 7,498,217 B2 | 3/2009 | Oh et al. | |
| 7,655,521 B2 * | 2/2010 | Ahn | 438/257 |
| 7,951,671 B2 * | 5/2011 | Lim et al. | 438/257 |
| 7,955,966 B2 * | 6/2011 | Gruber et al. | 438/616 |
| 2006/0284245 A1 * | 12/2006 | Park et al. | 257/324 |
| 2007/0284651 A1 | 12/2007 | Sim et al. | |
| 2008/0067571 A1 | 3/2008 | Kim et al. | |
| 2009/0207667 A1 * | 8/2009 | Park et al. | 365/185.33 |
| 2010/0090257 A1 * | 4/2010 | Terai et al. | 257/255 |
| 2010/0190315 A1 * | 7/2010 | Shin et al. | 438/396 |
| 2010/0213536 A1 * | 8/2010 | Nakanishi et al. | 257/324 |

FOREIGN PATENT DOCUMENTS

| | | |
|---|---|---|
| KR | 10-0757337 B1 | 9/2007 |
| KR | 10-0760633 B1 | 9/2007 |
| KR | 10-0829605 B1 | 5/2008 |

* cited by examiner

*Primary Examiner* — Charles Garber
*Assistant Examiner* — Ron Pompey
(74) *Attorney, Agent, or Firm* — Myers Bigel Sibley & Sajovec, P.A.

(57) ABSTRACT

Some methods are directed to manufacturing charge trap-type non-volatile memory devices. An isolation layer pattern can be formed that extends in a first direction in a substrate. A recess unit is formed in the substrate by recessing an exposed surface of the substrate adjacent to the isolation layer pattern. A tunnel insulating layer and a charge trap layer are sequentially formed on the substrate. The tunnel insulating layer and the charge trap layer are patterned to form an isolated island-shaped tunnel insulating layer pattern and an isolated island-shaped charge trap layer pattern by etching defined regions of the substrate, the isolation layer pattern, the tunnel insulating layer, and the charge trap layer until a top surface of the charge trap layer that is disposed on a bottom surface of the recess unit is aligned with a top surface of the isolation layer pattern. A blocking insulating layer is formed that covers the charge trap layer pattern, the isolation layer pattern, and a defined region of the substrate interposed between the charge trap patterns. A gate electrode pattern is formed on the blocking insulating layer to face the charge trap layer pattern. This manufacturing process may reduce charge spreading between unit memory cells and/or may prevent/avoid reduction in the breakdown voltage of the blocking insulating layer.

16 Claims, 7 Drawing Sheets

METHODS OF MANUFACTURING CHARGE TRAP-TYPE NON-VOLATILE MEMORY DEVICES

CROSS-REFERENCE TO RELATED APPLICATION

This application claims the benefit of priority under 35 U.S.C. §119 from Korean Patent Application No. 10-2009-0000437, filed in the Korean intellectual Property Office on Jan. 5, 2009, the contents of which are hereby incorporated herein by reference in its entirety.

BACKGROUND

1. Field

Example embodiments relate to methods of manufacturing charge trap-type non-volatile memory devices, and more particularly, to methods of manufacturing charge trap-type non-volatile memory devices that may improve charge spreading and may prevent/inhibit reduction in breakdown voltage of a blocking insulating layer.

2. Description of Related Art

In a charge trap-type memory device, a charge trap layer may be patterned to improve charge spreading. In this case, a blocking insulating layer formed on the charge trap layer may be patterned prior to patterning of the charge trap layer. However, a lot of defects may occur in sidewalls of the blocking insulating layer during etching of the blocking insulating layer. Such defects may reduce a breakdown voltage of the blocking insulating layer.

SUMMARY

Various embodiments provide methods of manufacturing charge trap-type non-volatile memory devices that may reduce malfunctions due to charge spreading between unit memory cells and/or may prevent a reduction in the breakdown voltage of a blocking insulating layer.

A method according to some example embodiments includes forming an isolation layer pattern that extends in a first direction in a substrate. A recess unit is formed in the substrate by recessing a surface of the substrate that is adjacent the isolation layer pattern. A tunnel insulating layer and a charge trap layer are sequentially formed on the substrate. The tunnel insulating layer and the charge trap layer are patterned to form isolated islands of the patterned tunnel insulating layer and charge trap layer by etching defined regions of the tunnel insulating layer and the charge trap layer until a top surface of the charge trap layer that is disposed along a bottom surface of the recess units is aligned with a top surface of the isolation layer pattern. A blocking insulating layer is formed that covers the charge trap layer pattern, the isolation layer pattern, and a defined region of the substrate between the charge trap patterns. A gate electrode pattern is formed on the blocking insulating layer to face the charge trap layer pattern.

Formation of the recess unit in the substrate may include forming a mask pattern on a region of the substrate on which a unit cell is not formed, and etching the substrate to a predetermined depth using the mask pattern as a mask. The mask pattern may have a line shape extending in a second direction perpendicular to the first direction. The mask pattern may be removed, and the substrate between the isolation layer patterns may be etched to a defined depth.

Formation of the recess unit in the substrate may include etching the substrate between the isolation layer patterns to a defined depth. A mask pattern may be formed on a region of the substrate on which a unit cell is formed. The mask pattern may have a line shape extending in a second direction that is perpendicular to the first direction. A region of the substrate that is exposed by the mask pattern may be grown using a selective epitaxial growth (SEG) process until that region of the substrate is aligned with the top surface of the isolation layer pattern. The mask pattern may then be removed.

The formation of the isolated island-shaped tunnel insulating layer pattern and the isolated island-shaped charge trap layer pattern may include forming a buffer layer on the charge trap layer after forming the charge trap layer. The buffer layer may be partially etched until the charge trap layer disposed on the isolation layer pattern is exposed. The charge trap layer disposed on a region other than the bottom surface of the recess unit may be etched until the charge trap layer remains only on the bottom surface of the recess unit, thereby forming the isolated island-shaped charge trap layer pattern. Defined regions of the isolation layer pattern, the buffer layer, the tunnel insulating layer, and the substrate may be removed until the charge trap layer pattern is exposed.

The charge trap layer that is on the region other than the bottom surface of the recess unit may be etched using a wet etching process.

The blocking insulating layer may be formed to extend across the entire surface of the substrate. The tunnel insulating layer may be formed by thermally oxidizing the substrate.

In some other embodiments, the manufacture of a charge trap-type non-volatile memory device includes forming an isolation layer pattern in a substrate. Recessed units are formed across a surface of the substrate by recessing the surface of the substrate between adjacent pairs of the isolation layer pattern. A tunnel insulating layer and a charge trap layer are sequentially formed on the substrate. The tunnel insulating layer and the charge trap layer are patterned to form isolated islands that are disposed within the recessed units. A blocking insulating layer is formed that covers the isolated islands of the patterned tunnel insulating layer and charge trap layer. A gate electrode pattern is formed on the blocking insulating layer and facing the charge trap layer pattern.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Figure 1:
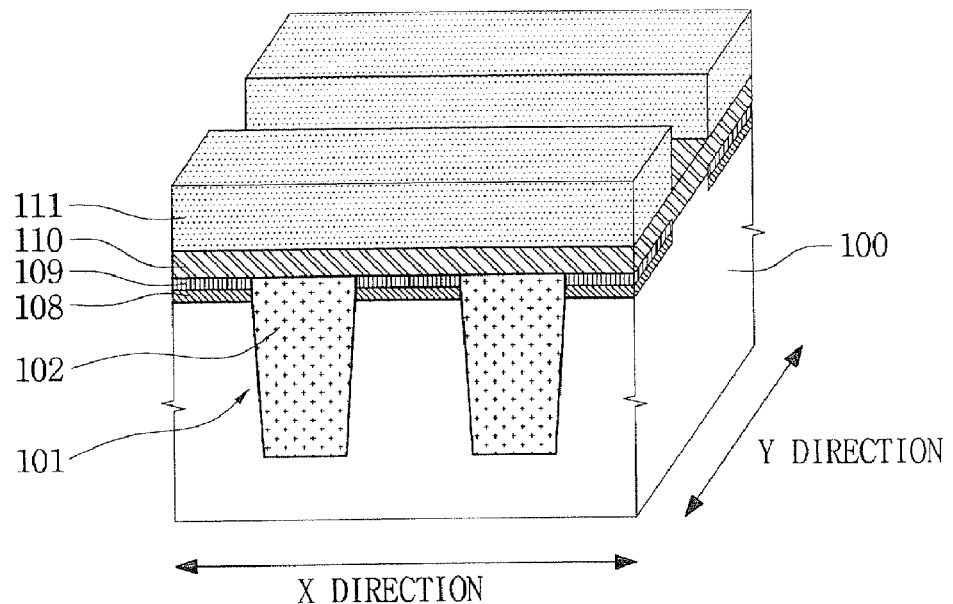
FIG. 1 is a perspective view of a charge trap-type non-volatile memory device according to example embodiments.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view of a charge trap-type non-volatile memory device according to example embodiments. In FIG. 1, an X direction may be perpendicular to a Y direction.

Referring to FIG. 1, a charge trap-type non-volatile memory device may include a substrate 100. The substrate 100 may be a silicon substrate, a silicon-on-insulator (SOI) substrate, a germanium (Ge) substrate, a germanium-on-insulator (GOI) substrate, or an epitaxial substrate obtained using a selective epitaxial growth (SEG) technique.

An isolation layer pattern 102 may be disposed on the substrate 100 and extend in the Y direction. The isolation layer pattern 102 may be formed of an insulating oxide, such as boro-phosphor silicate glass (BPSG), phosphor silicate glass (PSG), undoped silicate glass (USG), spin on glass (SOG), or plasma enhanced-tetraethylorthosilicate (PE-TEOS). A region where the isolation layer pattern 102 is not formed may be an active region.

A tunnel insulating layer pattern 108 and a charge trap layer pattern 109 may be sequentially stacked on the active region of the substrate 100. Each of the tunnel insulating layer pattern 108 and the charge trap layer pattern 109 may have an isolated island shape. The isolated island shape can refer to the charge trap layer pattern 109 being patterned so that the charge trap layer pattern 109 island formed in one unit memory cell is separate and isolated from the charge trap layer pattern 109 island in an adjacent unit memory cell. A top surface of the charge trap layer pattern 109 may be aligned with a top surface of the isolation layer pattern 102 to form a planar surface across the patterns 109 and 102. The tunnel insulating layer pattern 108 may be formed from silicon oxide or silicon oxynitride. The charge trap layer pattern 109 may be formed from silicon nitride.

A blocking insulating layer 110 may be disposed on the active region on which the isolation layer pattern 102 and the charge trap layer pattern 109 are formed. The blocking insulating layer 110 may or may not be patterned, and when it is not patterned it can extend across and cover the isolation layer pattern 102 and the active region.

The blocking insulating layer 110 may be formed of a metal oxide having a higher dielectric constant than silicon oxide. For example, the metal oxide may be aluminum oxide, hafnium oxide, zirconium oxide, lanthanum oxide, and/or hafnium-aluminum oxide, among others. Alternatively, the blocking insulating layer 110 may have a multilayered structure. For example, a silicon oxide layer may be further formed on at least one of top and bottom surfaces of a layer formed of the metal oxide to form the blocking insulating layer 110.

A gate electrode pattern 111 may be disposed on the blocking insulating layer 110 to face the charge trap layer pattern 109 and extend in the X direction. The gate electrode pattern 111 may be formed of a single layer or multiple layers formed of polysilicon (poly-Si), metal, metal nitride, and/or metal silicide. The metal, the metal nitride, and the metal silicide may be WSi, WN, TaN, TiN, W, and/or CoSi, among others.

In the above-described charge trap-type non-volatile memory device, because the charge trap layer pattern 109 may have an isolated island shape formed in a unit cell, which is separate and isolated from another charge trap layer pattern in an adjacent unit cell, malfunctions due to lateral spreading of trapped charges from one unit cell to another may be reduced. Also, the blocking insulating layer 110 may not be patterned but instead may cover the isolation layer pattern 102 and the active region, which may thereby prevent/inhibit a reduction in the breakdown voltage of the blocking insulating layer 110.

FIGS. 2 through 9 are perspective views illustrating methods of manufacturing a charge trap-type non-volatile memory device, such as the charge trap-type non-volatile memory device of FIG. 1, according to some example embodiments. In FIGS. 2 through 8, an X direction is perpendicular to a Y direction.

Figure 2:
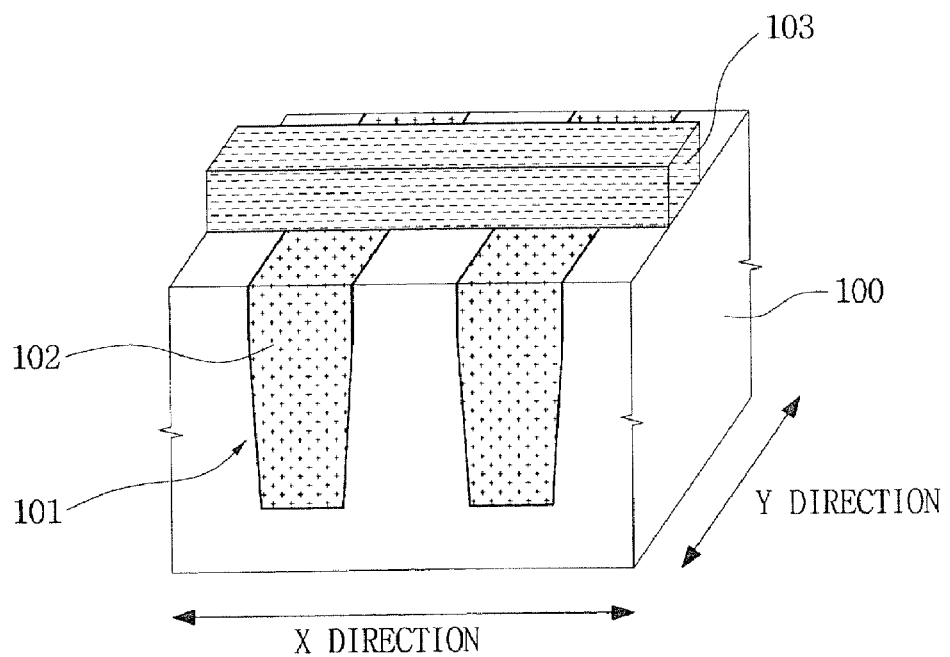
FIGS. 2 through 9 are perspective views illustrating methods of manufacturing a charge trap-type non-volatile memory device according to example embodiments.

Referring to FIG. 2, a substrate 100 formed of a semiconductor material may be prepared or provided. Thereafter, a predetermined region of the substrate 100 may be etched using an anisotropic etching process, thereby forming an isolation trench 101 extending in the Y direction. Afterwards, a thermal oxidation process may be performed to cure a sidewall of the isolation trench 101. In this case, an oxide layer (not shown) may be formed on an inner surface of the isolation trench 101.

Thereafter, the isolation trench 101 may be filled with an insulating material, thereby forming an isolation layer pattern 102. The insulating material may be an oxide, such as BPSG, PSG, USG, SOG, and/or PE-TEOS, among others. The isolation layer pattern 102 may be formed from such oxide using a spin coating process and/or a chemical vapor deposition (CVD) process.

Afterwards, a mask pattern 103 may be formed on the substrate 100. The mask pattern 103 may have a line shape extending in the X direction. The mask pattern 103 may be formed on a region of the substrate 100 on which a unit cell is not formed.

Figure 3:
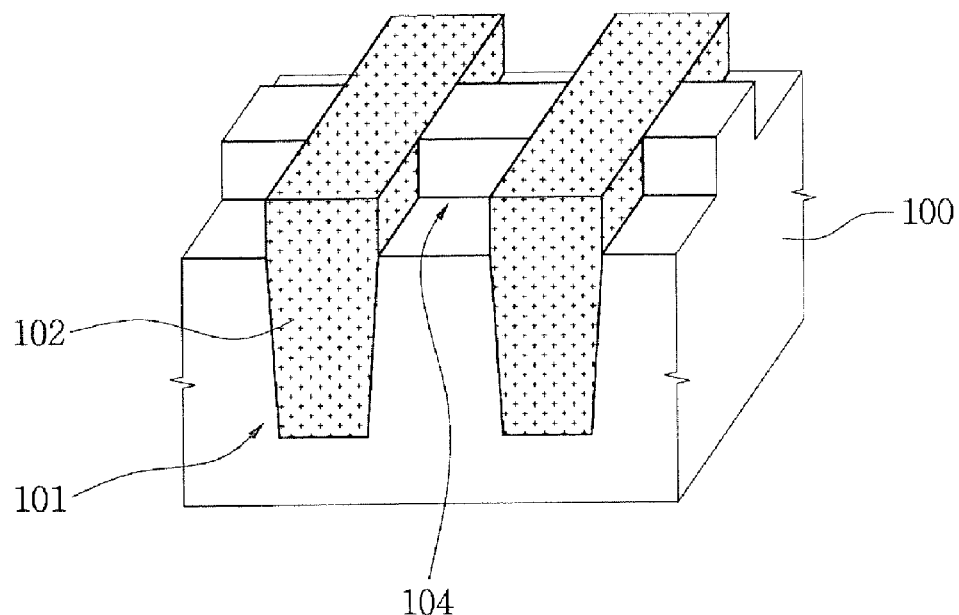

Referring to FIG. 3, the substrate 100 may be selectively etched to a predetermined depth using the mask pattern 103 as an etch mask, thereby forming a recess unit 104. The mask pattern 103 may thereafter be removed.

Figure 4:
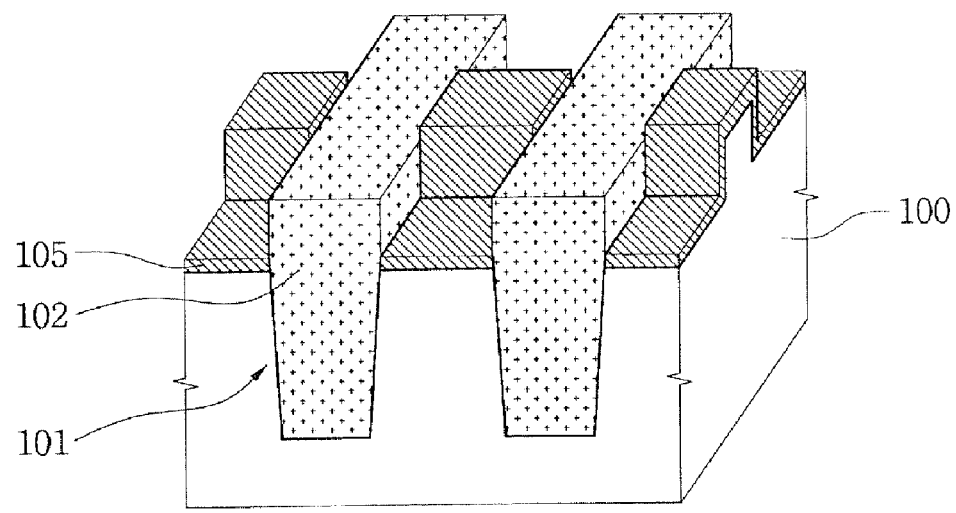

Referring to FIG. 4, the substrate 100 may be thermally oxidized to form a tunnel insulating layer 105 on the active region on which the isolation layer pattern 102 is not formed.

Figure 5:
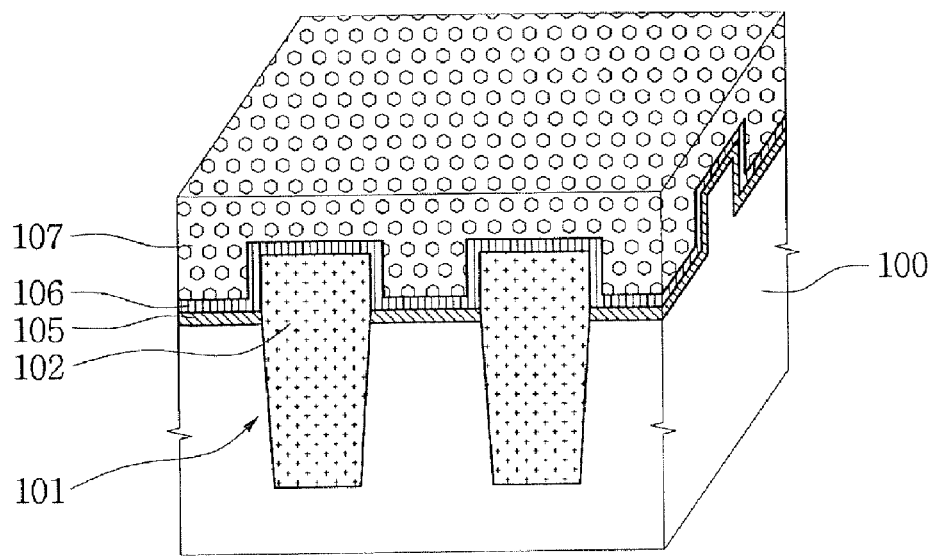

Referring to FIG. 5, a charge trap layer 106 may be formed on the active region on which the tunnel insulating layer 105 is formed and on the isolation layer pattern 102. The charge trap layer 106 may be formed of silicon nitride using a CVD process.

Thereafter, a buffer layer 107 may be formed on the charge trap layer 106. The buffer layer 107 may serve to protect the charge trap layer 106 during subsequent processes. The buffer layer 107 may be formed of an oxide, for example, medium temperature oxide (MTO), which has an etch selectivity with respect to the charge trap layer 106. The buffer layer 107 may be formed to a thickness that is sufficient to fill the recess unit 104 and to cover the entire charge trap layer 106 disposed on the isolation layer pattern 102.

Figure 6:
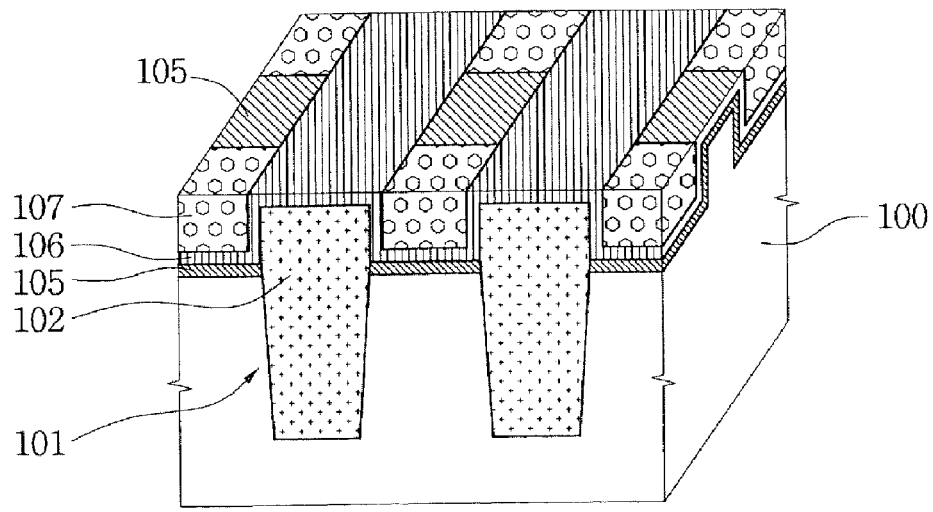

Referring to FIG. 6, the buffer layer 107 may be partially removed using a planarization process until the charge trap layer 106 disposed on the isolation layer pattern 102 is exposed. The planarization process may be a chemical mechanical polishing (CMP) process and/or an etch-back process.

Figure 7:
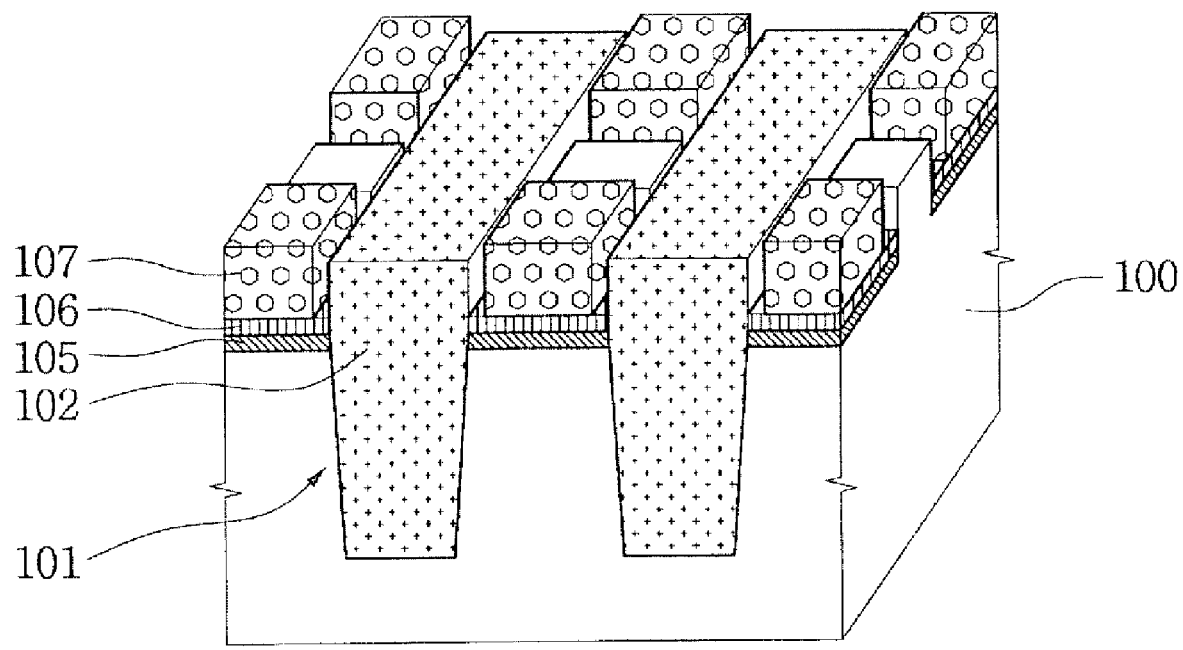

Referring to FIG. 7, the charge trap layer 106 disposed on a region other than a bottom surface of the recess unit 104 may be removed (e.g., etched) until the charge trap layer 105 remains only along the bottom surface of the recess unit 104. As a result, an isolated island-shaped charge trap layer pattern 109 may be formed. The etching of the charge trap layer 106 may be performed using a dry and/or wet etching process. Preferably, though not necessarily, the charge trap layer 106 may be wet etched because less damage may be caused to the charge trap layer pattern 109 compared to if a dry etching process were exclusively used.

Figure 8:
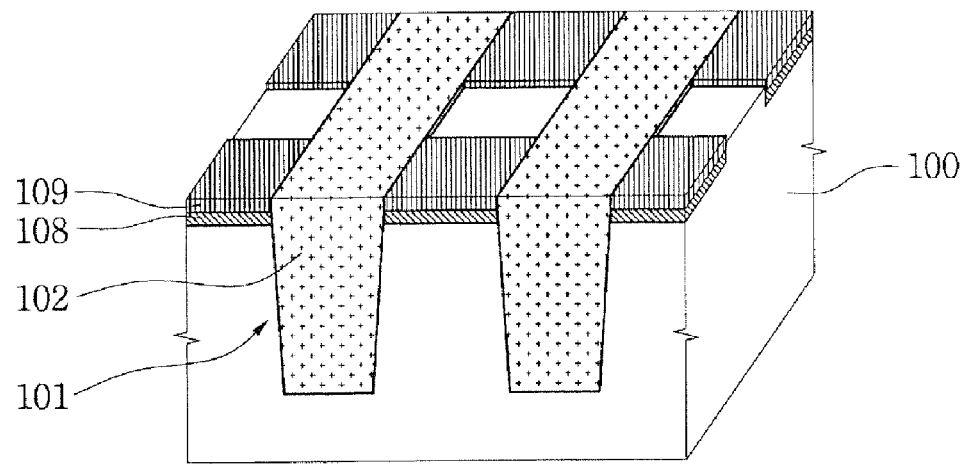

Referring to FIG. 8, thereafter, predetermined regions of the isolation layer pattern 102, the buffer layer 107, the tunnel insulating layer 105, and the substrate 100 may be removed using a planarization process until the charge trap layer pattern 109 is exposed. The planarization process may be a CMP process or an etch-back process. The tunnel insulating layer 105 may be divided into isolated island-shaped tunnel insulating layer patterns 108 formed in respective unit cells.

Figure 9:
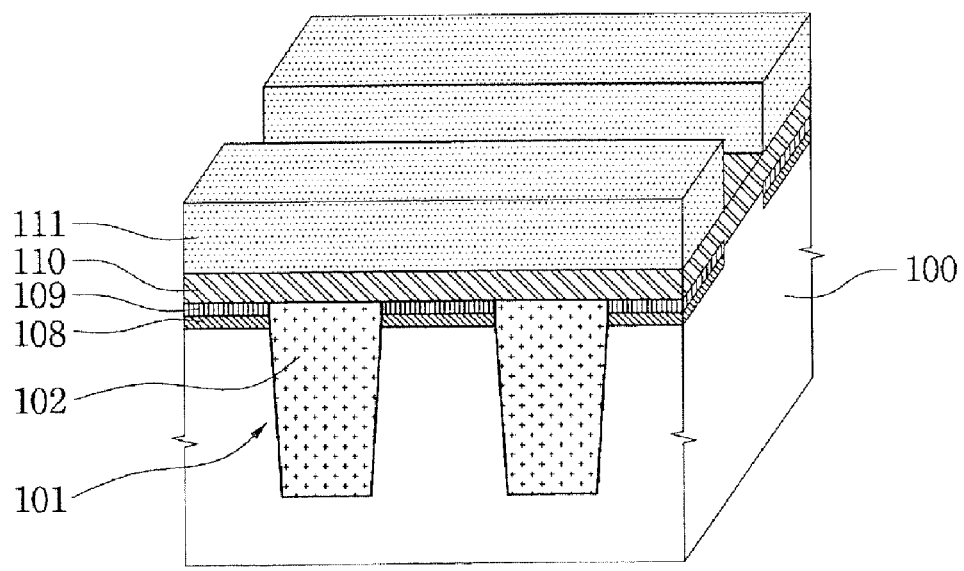

Referring to FIG. 9, a blocking insulating layer 110 may be formed on an entire of the substrate 100 on which the isolation layer pattern 102 and the charge trap layer pattern 109 are formed. The blocking insulating layer 110 may be not patterned so that it extends across the entire surface of the substrate 100.

Subsequently, a gate electrode pattern 111 may be formed on the blocking insulating layer 110 to face the charge trap layer pattern 109 and extend in the X direction.

Figure 10:
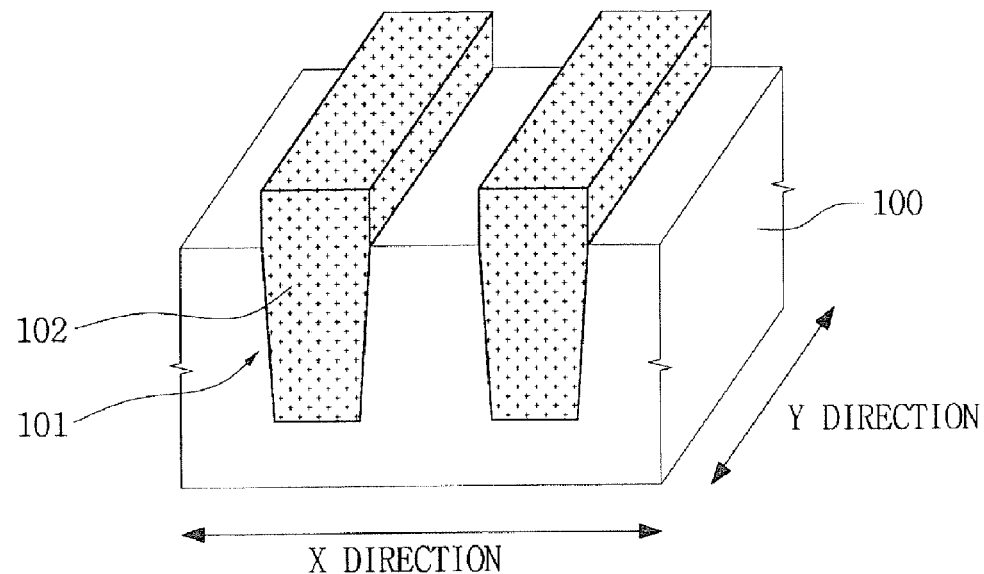
FIGS. 10 through 12 are perspective views illustrating methods of manufacturing a charge trap-type non-volatile memory device according to other example embodiments.
Figure 11:
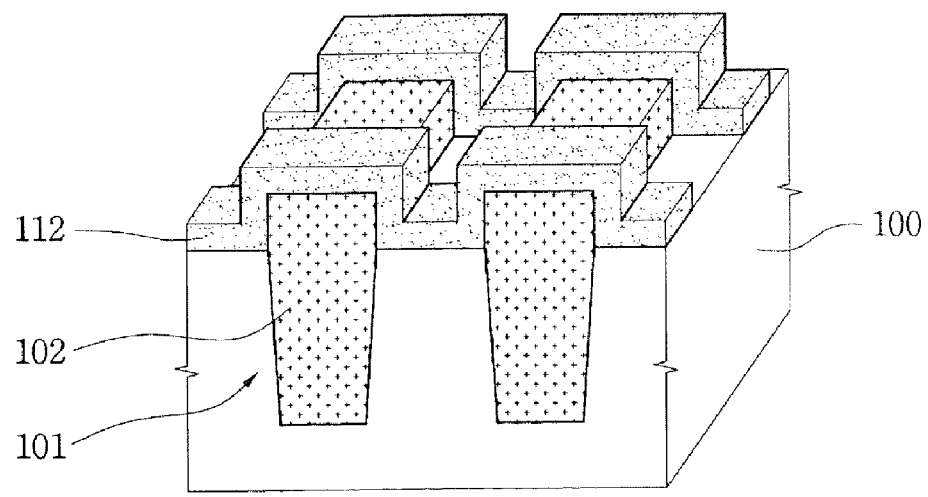
Figure 12:
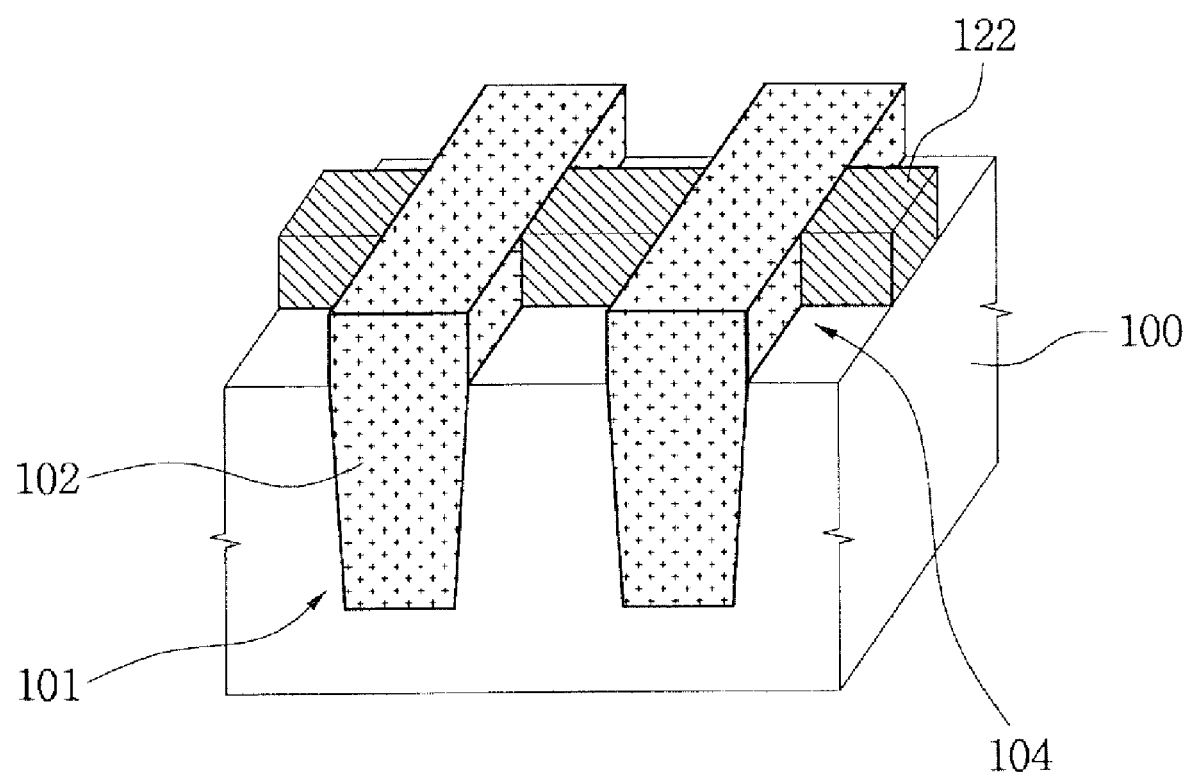

FIGS. 10 through 12 are perspective views illustrating methods of manufacturing a charge trap-type non-volatile memory device according to other example embodiments. Specifically, FIGS. 9 through 11 illustrate methods that may be used to form the recess unit of FIG. 3. In FIGS. 9 through 11, an X direction is perpendicular to a Y direction.

Referring to FIG. 10, a substrate 100 formed of a semiconductor material may be prepared or provided. Thereafter, a predetermined region of the substrate 100 may be etched using an anisotropic etching process, thereby forming an isolation trench 101 extending in the Y direction. The isolation trench 101 may be filled with an insulating material, thereby forming an isolation layer pattern 102.

Afterwards, an active region of the substrate 100 on which the isolation layer pattern 102 is not formed may be etched to a predetermined depth.

Referring to FIG. 11, a mask pattern 112 may be formed on predetermined regions of the substrate 100 and the isolation layer pattern 102. The mask pattern 112 may have a line shape extending in the X direction. The mask pattern 112 may be formed on a region of the substrate 100 on which a unit cell is formed.

Referring to FIG. 12, a predetermined region 122 of the substrate 100, which is exposed by the mask pattern 102, may be grown using an SEG technique until the predetermined region 122 of the substrate 100 is aligned with a top surface of the isolation layer pattern 102. Afterwards, the mask pattern 112 may be removed. Thus, as shown in FIG. 3, a recess unit 104 may be formed in a region of the substrate 100 on which a unit cell is formed.

Subsequently, the processes that were described above with reference to FIGS. 4 through 9 may be performed to further complete the manufacture of a charge trap-type non-volatile memory device such as that shown in FIG. 1.

As described above, because a charge trap layer pattern is formed as an isolated island in a unit cell and is separate and isolated from another charge trap layer pattern island in an adjacent unit cell, charge spreading between the unit cells may be avoided/reduced. Moreover, as described above, the blocking insulating layer may not be patterned so that it instead continuously covers an active region and an isolation region which may prevent/avoid reduction in the breakdown voltage of the blocking insulating layer.

The foregoing is illustrative of example embodiments and is not to be construed as limiting thereof. Although a few example embodiments have been described, those skilled in the art will readily appreciate that many modifications are possible in the example embodiments without materially departing from the novel teachings of example embodiments. Accordingly, all such modifications are intended to be included within the scope of the present invention as defined in the claims.

What is claimed is:

1. A method of manufacturing a charge trap-type nonvolatile memory device, the method comprising:
    forming an isolation layer pattern extending in a first direction in a substrate;
    forming recess units in a surface of the substrate by recessing the surface of the substrate that is adjacent the isolation layer pattern;
    sequentially forming a tunnel insulating layer and a charge trap layer on the substrate;
    patterning the tunnel insulating layer and the charge trap layer to form isolated islands of the patterned tunnel insulating layer and charge trap layer by removing defined regions of the tunnel insulating layer and the charge trap layer until a top surface of the charge trap layer that is disposed along a bottom surface of the recess units is aligned with a top surface of the isolation layer pattern;
    forming a blocking insulating layer to cover the charge trap layer pattern, the isolation layer pattern, and a defined region of the substrate between the charge trap patterns; and
    forming a gate electrode pattern on the blocking insulating layer to face the charge trap layer pattern,
    wherein patterning the tunnel insulating layer and the charge trap layer comprises:
        forming a buffer layer on the charge trap layer after forming the charge trap layer;
        partially removing the buffer layer until the charge trap layer that is on the isolation layer pattern is exposed;
        etching the charge trap layer that is on a region other than the bottom surface of the recess unit until the charge trap layer remains only on the bottom surface of the recess unit, and forms an isolated island-shaped charge trap layer pattern; and
        removing defined regions of the isolation layer pattern, the buffer layer, the tunnel insulating layer, and the substrate until the charge trap layer pattern is exposed.

2. The method of claim 1, wherein forming the recess unit in the substrate comprises:
    forming a mask pattern on a region of the substrate on which a unit cell is not formed, the mask pattern having a line shape extending in a second direction that is perpendicular to the first direction;
    etching the substrate to a defined depth using the mask pattern as an etching mask; and
    removing the mask pattern.

3. The method of claim 1, wherein etching the charge trap layer that is on the region other than the bottom surface of the recess unit is performed using a wet etching process.

4. The method of claim 1, wherein the removing of the buffer layer is performed using a chemical mechanical polishing (CMP) process or an etch-back process.

5. The method of claim 1, wherein the removing of defined regions of the isolation layer pattern, the buffer layer, the tunnel insulating layer, and the substrate is performed using a chemical mechanical polishing (CMP) process or an etch-back process.

6. The method of claim 1, wherein the blocking insulating layer is continuously formed on the entire surface of the substrate without a patterned region.

7. The method of claim 1, wherein forming the tunnel insulating layer comprises thermally oxidizing the substrate to form the tunnel insulating layer on the active region on which the isolation layer pattern is not formed.

8. The method of claim 7, wherein forming the charge trap layer comprises depositing silicon nitride using a CVD process on the active region on which the tunnel insulating layer is formed and the isolation layer pattern.

9. A method of manufacturing a charge trap-type nonvolatile memory device, the method comprising:
    forming an isolation layer pattern in a substrate;
    forming recessed units across a surface of the substrate by recessing the surface of the substrate between adjacent pairs of the isolation layer pattern;
    sequentially forming a tunnel insulating layer and a charge trap layer on the substrate;
    patterning the tunnel insulating layer and the charge trap layer to form isolated islands that are disposed within the recessed units;
    forming a blocking insulating layer to cover the isolated islands of the patterned tunnel insulating layer and charge trap layer; and
    forming a gate electrode pattern on the blocking insulating layer and facing the charge trap layer pattern,
    wherein patterning the tunnel insulating layer and the charge trap layer comprises:
        forming a buffer layer on the charge trap layer after forming the charge trap layer;
        partially removing the buffer layer until the charge trap layer that is on the isolation layer pattern is exposed;
        etching the charge trap layer that is on a region other than the bottom surface of the recess unit until the charge trap layer remains only on the bottom surface of the recess unit, and forms an isolated island-shaped charge trap layer pattern; and
        removing defined regions of the isolation layer pattern, the buffer layer, the tunnel insulating layer, and the substrate until the charge trap layer pattern is exposed.

10. The method of claim 9, wherein patterning the tunnel insulating layer and the charge trap layer comprises etching defined regions of the tunnel insulating layer and the charge trap layer until the tunnel insulating layer and the charge trap layer residing in one of the recessed units is isolated from the tunnel insulating layer and the charge trap layer residing in adjacent ones of the recessed units.

11. A method of manufacturing a memory device, the method comprising:
    forming an isolation layer pattern in a substrate,
    forming a recess in a portion of the substrate,
    conformably forming a first insulating layer in the recess,
    conformably forming a second insulating layer on the first insulating layer,
    removing upper portions of the substrate and the isolation pattern layer to be same level with top surfaces of the second insulating layer, the isolation pattern layer, and the substrate so that the second insulating layer remaining only on the bottom surface of the recess,
    forming a third insulating layer on the second insulating layer, and forming a gate electrode pattern on the third insulating layer.

12. The method of claim 11, wherein the recess includes four sidewalls and a bottom surface, the two of the four sidewalls exposing the substrate and the other two of the four sidewalls exposing the isolation pattern layer.

13. The method of claim 12, wherein the bottom surface of the recess exposes the substrate.

14. The method of claim 11, wherein removing upper portions of the substrate and the isolation pattern layer include performing a CMP process.

15. The method of claim 11, wherein the first insulating layer includes a silicon oxide and the second insulating layer includes a silicon nitride layer, and the third insulating layer includes a metal oxide.

16. The method of claim 11, wherein the recess is shallower than isolation pattern layer from a top surface of the substrate.

* * * * *